(12) United States Patent
Hold

(10) Patent No.: US 8,599,626 B2
(45) Date of Patent: Dec. 3, 2013

(54) MEMORY DEVICE AND A METHOD OF OPERATING SUCH A MEMORY DEVICE IN A SPECULATIVE READ MODE

(75) Inventor: Betina Hold, El Dorado Hills, CA (US)

(73) Assignee: ARM Limited, Cambridge (GB)

( * ) Notice: Subject to any disclaimer, the term of this patent is extended or adjusted under 35 U.S.C. 154(b) by 42 days.

(21) Appl. No.: 13/313,066

(22) Filed: Dec. 7, 2011

(65) Prior Publication Data

US 2013/0148443 A1 Jun. 13, 2013

(51) Int. Cl.
*G11C 7/00* (2006.01)

(52) U.S. Cl.
USPC ...................................... 365/189.15

(58) Field of Classification Search
None
See application file for complete search history.

(56) References Cited

U.S. PATENT DOCUMENTS

| | | | |
|---|---|---|---|
| 7,260,001 B2 | 8/2007 | Bull | |
| 7,263,015 B2 | 8/2007 | Blaauw et al. | |
| 7,278,080 B2 | 10/2007 | Flautner et al. | |
| 2004/0223386 A1* | 11/2004 | Mudge et al. | ................ 365/202 |
| 2008/0209152 A1 | 8/2008 | Bull | |

OTHER PUBLICATIONS

Ernst et al., "Razor: A Low-Power Pipeline Based on Circuit-Level Timing Speculation", *36th Annual Int'l. Symposium on Microarchitecture*, Dec. 2003, 12 pages.
Austin et al., "Making Typical Silicon Matter with Razor", *IEEE Computer Society*, Mar. 2004, pp. 57-65.

* cited by examiner

*Primary Examiner* — Hoai V Ho
*Assistant Examiner* — James G Norman
(74) *Attorney, Agent, or Firm* — Nixon & Vanderhye P.C.

(57) ABSTRACT

A memory includes an array of memory cells with each memory cell coupled to an associated pair of bit lines. Read control circuitry is configured to activate a number of addressed memory cells in order to couple each addressed memory cell to its associated pair of bit lines. Sense amplifier circuitry is then coupled to the bit lines to determine the data value stored in each addressed memory. In a speculative read mode of operation, the sense amplifier circuitry evaluates the differential signals. Error detection circuitry is then used to capture the differential signals on the associated pair of bit lines for each addressed memory cell, and to apply an error detection operation to determine if the differential signals as evaluated by the sense amplifier circuitry had not developed to the necessary degree and, in that event, an error signal is asserted.

17 Claims, 11 Drawing Sheets

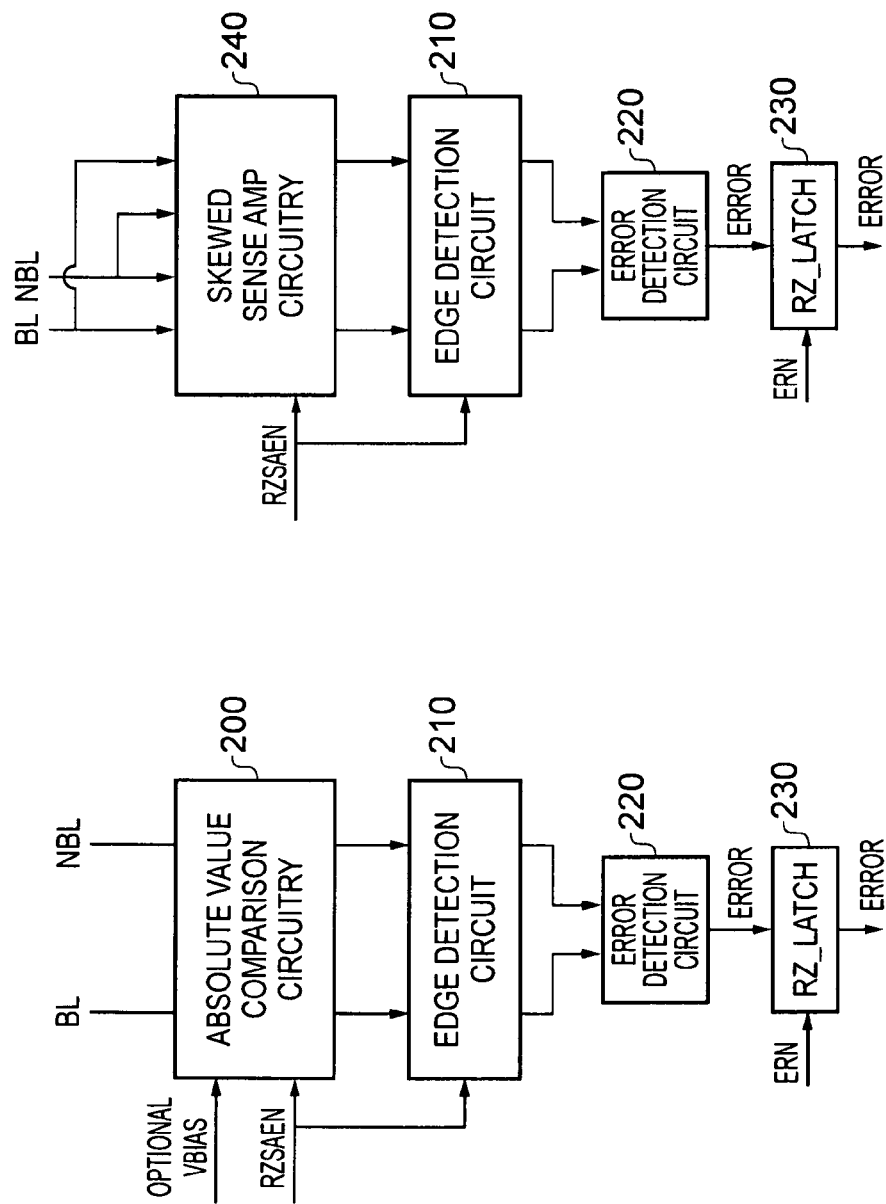

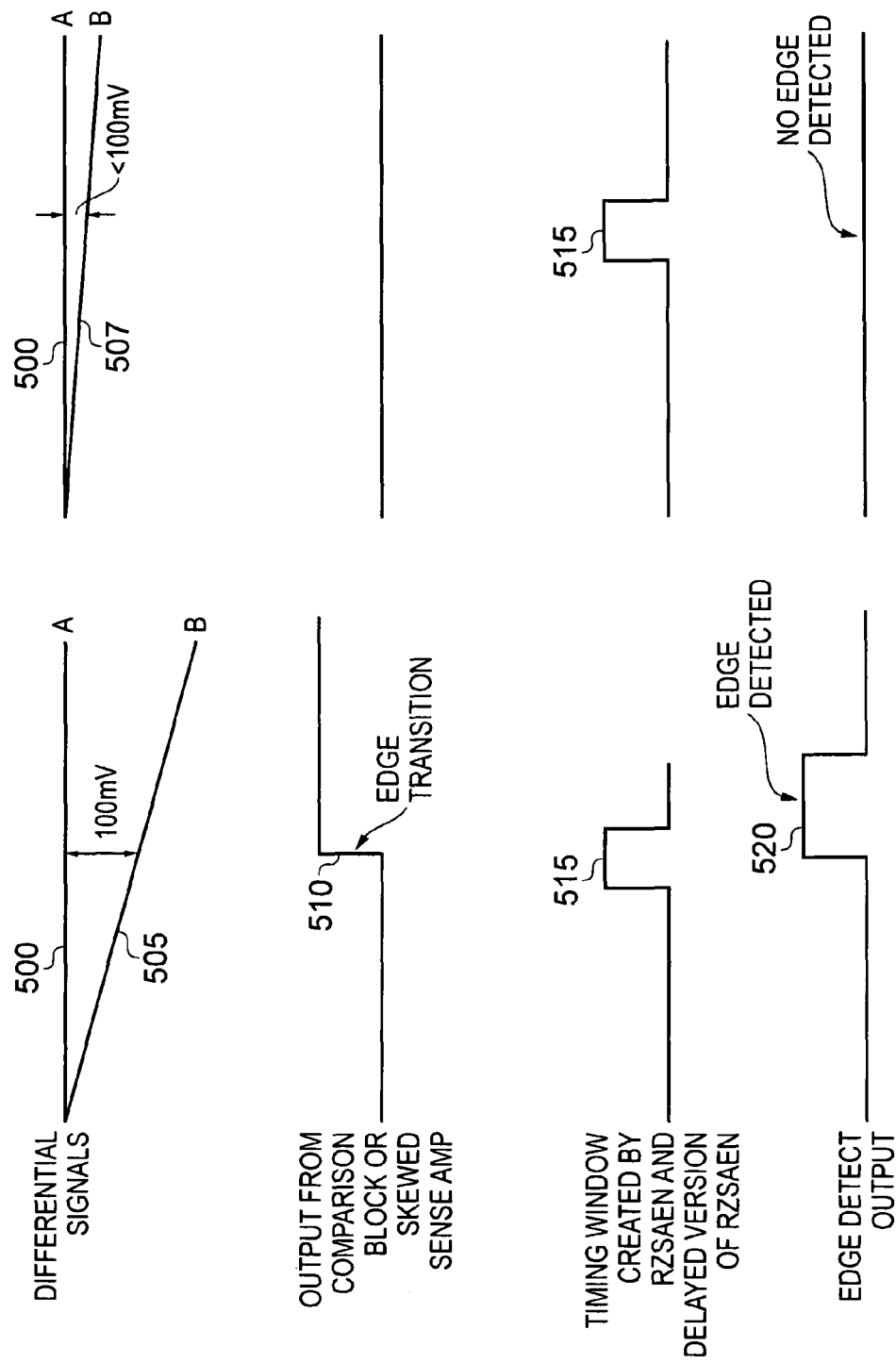

MEMORY DEVICE AND A METHOD OF OPERATING SUCH A MEMORY DEVICE IN A SPECULATIVE READ MODE

BACKGROUND OF THE INVENTION

1. Field of the Invention

The present invention relates to a memory device and a method of operating such a memory device in a speculative read mode.

2. Description of the Prior Art

As process geometries shrink in modern data processing systems, the variability in the operating characteristics of the individual circuit elements increases. Considering as an example a memory device consisting of an array of memory cells, it will be understood that each memory cell will typically consist of a number of electronic components such as transistors, and the variability in those individual components significantly increases as process geometries shrink. Furthermore, there is an increasing desire to operate data processing systems at lower and lower supply voltages, and as the supply voltage decreases, reliability issues due to the variations in the individual components become more prominent.

In order to ensure correct operation of a memory, memory system designers normally operate the memory system to sample a read value therefrom at a time chosen to ensure that the correct read value will have been driven out from the memory given a worst case set of assumptions surrounding manufacturing variation, ambient conditions, etc associated with the memory system concerned. Hence, a memory system designer will calculate a slowest likely read speed and then add a certain safety margin to this when deciding at what speed the memory should be operated. Whilst this approach is safe in terms of ensuring correct operation and data integrity, it can significantly limit the data processing performance that may be achieved.

Furthermore, given the increase in variability of components that occurs as process geometries shrink, this will then lead to larger margins needing to be specified in order to ensure correct operation.

With the aim of seeking to remove worst case safety margins, ARM Limited developed an in-situ error detection and correction technique often referred to as Razor. The basic Razor technique is described in U.S. Pat. No. 7,278,080, the entire contents of which are hereby incorporated by reference. In accordance with the basic Razor technique, errors are detected in processing stages by comparison of a non-delayed data value with a delayed data value, these data values being captured at slightly different times. In the event of a difference in the data values compared, this indicates an error condition, and the error can be corrected in-situ. By incorporation of such techniques, it is then possible to reduce the safety margins within a design, since it is possible to cope with a small non-zero error rate in the data due to the ability of the Razor mechanism to protect and correct such errors in-situ.

Returning to the particular issue of reading data from a memory device, the individual memory cells are typically connected to a pair of bit lines, and during a read operation, one of the bit lines coupled to an addressed memory cell will discharge whilst the other remains at a precharged logic level, which bit line discharges being dependent on the data value stored within the addressed memory cell. Sense amplifier circuitry can then be used to detect the differential signals developing on the pair of bit lines for each addressed memory cell in order to determine the data value stored in each addressed memory cell. To ensure correct operation, the memory system designer needs to allow a read time to elapse before the sense amplifier circuitry is triggered to sense the signals on the bit lines, and typically that read time will be set long enough to ensure that in the worst case conditions the differential signals on the bit lines will have developed to a sufficient extent to ensure correct sensing of the data values by the sense amplifier circuitry. Hence, purely by way of illustration, it may be necessary for there to be at least 100 mV of potential difference between the signals on the pair of bit lines before it can be guaranteed that a sense amplifier will correctly detect the data value stored in the addressed memory cell connected to those bit lines.

However, it will be appreciated that by setting the read time so as to account for the worst case conditions, this can significantly impact the speed of operation of the memory device, since in many situations it would have been possible to have read the data earlier due to the differential signals developing more quickly than in the worst case scenario.

With the above issue in mind, commonly owned U.S. Pat. No. 7,260,001, the entire contents of which are hereby incorporated by reference, describes a Razor-style approach for performing a read operation within a memory device. In accordance with the technique described therein, both a fast data reading mechanism and a slow data reading mechanism are provided, in one embodiment both data reading mechanisms being formed by sense amplifier circuits. The fast data reading mechanism is arranged to read a data value from the memory in order to generate a fast read result that is output from the memory for further processing, whilst the slow data reading mechanism reads the data value from said memory to generate a slow read result available after the fast read result has been output for further processing, the slow data reading mechanism being less prone to error in reading the data value than the fast data reading mechanism. The fast read result and the slow read result are then compared to detect if the fast read result differs from the slow read result, and error repair logic is then used if the results differ in order to suppress any further processing based on the fast read result. In that scenario, the slow read result is then typically output in place of the fast read result with the further processing then being restarted based upon the slow read result.

Whilst such an approach can improve performance of the memory device by reducing the margins that are incorporated when setting the read time, it can give rise to a number of problems. In particular, since the voltage on the bit lines need to be sensed at two different times, the bit lines cannot begin to be precharged for the next read operation until both the fast data reading mechanism and the slow data reading mechanism have sampled the data on the bit lines, and accordingly this limits the operating speed of the memory device. This also adversely affects power consumption, since the bit lines are discharged to a lower point by the time the slow data reading mechanism has sampled the data, and accordingly more power is consumed in each precharge operation. In addition, due to the need to resample the data via the slow data reading mechanism, various disturbance effects can arise. As one example, there will be leakage within each column of bit lines from the non-addressed memory cells connected to that column, such that after a period of time the bit line that is not discharging due to the contents of the addressed memory cell does in any event start to lose voltage due to leakage current, thereby giving rise to an accuracy problem in detection of the data by the slow data reading mechanism. Further, such leakage also increases power consumption.

Accordingly, it would be desirable to provide an improved technique for increasing the performance of read operations within a memory device.

SUMMARY OF THE INVENTION

Viewed from a first aspect, the present invention provides a memory device comprising: an array of memory cells, each memory cell being coupled to an associated pair of bit lines; read control circuitry configured during a read operation to activate a number of addressed memory cells in order to couple each addressed memory cell to its associated pair of bit lines; sense amplifier circuitry coupled to the bit lines and configured during the read operation to determine the data value stored in each addressed memory cell by evaluation of differential signals that develop on the associated pair of bit lines during the read operation in dependence on the data value stored in that addressed memory cell; the sense amplifier circuitry being configured in a speculative read mode of operation to evaluate the differential signals on the associated pair of bit lines for each addressed memory cell after a speculative read time period that is not guaranteed to be sufficient for the differential signals to have developed to a degree necessary for the sense amplifier circuitry to correctly determine the data value stored in each addressed memory cell; and error detection circuitry configured, in said speculative read mode of operation, to capture the differential signals on the associated pair of bit lines for each addressed memory cell and to apply an error detection operation to determine if the differential signals as evaluated by the sense amplifier circuitry had not developed to the degree necessary for the sense amplifier circuitry to correctly determine the data value stored in each addressed memory cell, and if so to assert an error signal.

In accordance with the present invention, error detection circuitry is provided which is used in a speculative read mode of operation to perform some analysis of the differential signals on the associated pair of bit lines for each addressed memory cell. In particular, the error detection circuitry applies an error detection operation to determine if the differential signals that were sampled by the sense amplifier circuitry had not developed to the degree necessary for the sense amplifier circuitry to accurately determine the data value stored in each addressed memory cell, and in that event an error signal is asserted.

The error detection circuitry may be configured to capture the differential signals as evaluated by the sense amplifier circuitry (i.e. to sample the differential signals at the same time as they are sampled by the sense amplifier circuitry), or alternatively in some embodiments may capture the differential signals some short time period after they are sampled by the sense amplifier circuitry. By such an approach, the differential signals developing on the bit lines only need to be sampled at one point in time, or at two points in time sufficiently close to each other not to delay the precharging operation of the memory device. In the speculative read mode of operation, the sense amplifier circuitry is caused to perform such sampling after a speculative read time period that is not guaranteed to be sufficient for the differential signals to have developed to the necessary degree for accurate determination of the data value stored in each addressed memory cell. However, due to the presence of the error detection circuitry which then performs the above described error analysis, if in fact the differential signals had not developed to the necessary degree this can be detected and an error signal asserted.

Since the error detection circuitry samples the differential signals at the same time as the sense amplifier circuitry does, or very shortly thereafter, there is no need to delay the operation of the memory device once the sense amplifier circuitry has evaluated the differential signals based on the speculative read time period, and in particular it is possible to thereafter begin to precharge the memory cells in preparation for a subsequent read operation without awaiting the outcome of the error detection operation performed by the error detection circuitry. Accordingly, significant performance benefits can be realised when the memory device is operated in the speculative read mode of operation due to the use of a speculative read time period that will be shorter than a read time period set if the speculative read mode of operation were not used. In situations where the read data output by the sense amplifier circuitry cannot be guaranteed to be correct, this can be detected by the error detection circuitry, and any required remedial action then invoked in response to the asserted error signal from the error detection circuitry.

Various types of remedial action may be taken in response to the asserted error signal. For example, in one embodiment any subsequent actions that had been taken in dependence on the read data output from the sense amplifier circuitry that has now been determined as being potentially inaccurate can be invalidated and those actions reperformed once the read operation has been retried. In one embodiment, when retrying the read operation, the speculative read time period can be adjusted prior to the re-try operation, thereby increasing the likelihood that the read data will be correctly sensed when the read operation is re-tried. In one embodiment, it is possible to avoid the need for retrying the read operation altogether, if the error detection circuitry produces, as a by-product of its error analysis, the correct read data value.

In one embodiment, the speculative read time period is adjustable. In particular, in one embodiment read time period adjustment circuitry is provided for adjusting the speculative read time period in response to the error signal asserted by the error detection circuitry. The read time period adjustment circuitry can in one embodiment be provided as part of the memory device, but in an alternative embodiment can be provided externally to the memory device, for example as part of some external error analysis circuitry. It will be understood that the read time period being referred to herein is not the same as the cycle time or clock period. In particular, merely changing how quickly an access to memory is performed (by altering the cycle time or clock period) is not sufficient to change how the sense amplifier circuitry evaluates the data value, and instead the timing of the internal capture of the bit cell data by the sense amplifier circuitry needs to be adjusted to achieve this. It is this timing of the internal capture of the bit cell data by the sense amplifier circuitry which is varied by altering the read time period.

In one embodiment, the memory device may be permanently configured to operate in the speculative read mode of operation such that all read operations are performed using the speculative read time period. However, in an alternative embodiment, a non-speculative read mode of operation is also supported. In one particular embodiment, in the non-speculative read mode of operation the sense amplifier circuitry is configured to evaluate the differential signals on the associated pair of bit lines for each addressed memory cell after a non-speculative read time period longer than said speculative read time period, said non-speculative read time period being guaranteed to be sufficient for the differential signals to have developed to a degree necessary for the sense amplifier circuitry to correctly determine the data value stored in each addressed memory cell. Since in the non-speculative read mode the bit line voltages sampled by the sense amplifier circuitry can be guaranteed to be sufficient for correct operation, there is no need for the error detection circuitry to be used in that embodiment, and accordingly that circuitry can be disabled to reduce power consumption when operating in the non-speculative read mode.

The error detection circuitry can take a variety of forms. In one embodiment, the error detection circuitry comprises, for each pair of bit lines, comparison circuitry configured to independently compare with a reference value the value of the differential signals on the associated pair of bit lines for each addressed memory cell, in order to produce a pair of comparison outputs. In one particular embodiment, such comparison circuitry can be implemented by an op amp style high speed level detector.

In one embodiment the error detection circuitry further comprises a gain circuit at the input to the comparison circuitry to amplify the differential signals as evaluated by the sense amplifier circuitry before input to the comparison circuitry. By amplifying the differential signals prior to input to the comparison circuitry, this can increase the speed of operation of the comparison circuitry, and hence decrease the time taken to perform the error detection operation.

There are a number of ways in which the pair of comparison outputs produced by the comparison circuitry can be evaluated. In one embodiment, the comparison circuitry is configured to compare with the reference value the differential signals as evaluated by the sense amplifier circuitry, and the error detection circuitry further comprises edge capture circuitry connected to the pair of comparison outputs from the comparison circuitry and arranged to determine whether one of those comparison outputs changes logic state during a pulse period whose timing is derived from the speculative read time period. Whilst the timing of the pulse period is derived from the speculative read time period, the width of the actual pulse can be set having regard to a variety of factors. In one embodiment, the width of the pulse is chosen having regard to an evaluation time required by the comparison circuitry to produce outputs indicative of its inputs. In normal operation, it will be expected that one of the comparison outputs will change state during the pulse period. Hence, in such embodiments, the error signal is set if neither of the comparison outputs change logic state during the pulse period or if both of the comparison outputs change logic state during the pulse period. It will be understood that the edge detection process does not capture the data value itself, but rather a transition of a bit line to a particular point during a certain period of time.

It is not necessary to use edge capture circuitry as discussed above in order to analyse the pair of comparison outputs produced by the comparison circuitry. For example, in another embodiment, the error detection circuitry further comprises error signal generation circuitry for receiving the pair of comparison outputs and for asserting an internal error signal if the comparison outputs have the same value, and a latch configured to capture the value of the internal error signal in a predetermined timing window and to output the latched value as said error signal. Hence, in this embodiment, the error signal generation circuitry evaluates the comparison outputs, and a latch is used to capture the value of the internal error signal generated by the error signal generation circuitry in a predetermined timing window. It is that latched value which is then output as the error signal.

In one embodiment, the error detection circuitry further comprises further error check circuitry, responsive to the error signal output from said latch indicating that no error has been detected, to compare the pair of comparison outputs from the comparison circuitry with the equivalent outputs from the sense amplifier circuitry and to modify the error signal to identify the presence of an error if the outputs from the comparison circuitry do not match the equivalent outputs from the sense amplifier circuitry. By using such an approach, it is not necessary to restrict the error detection circuitry to evaluate the differential signals present on the bit lines at exactly the same time as the sense amplifier circuitry samples them in the speculative read mode of operation. This hence enables the sense amplifier circuitry to sample the bit lines in the speculative read mode of operation at a timing which is "borderline" (i.e. may not have allowed the differential signals to have developed to the degree necessary to ensure correct operation of the sense amplifier circuitry), with the error detection circuitry then sampling the bit lines at a slightly later time just before the precharge phase starts.

Whilst in one embodiment comparison circuitry is used to analyse the differential signals as evaluated by the sense amplifier circuitry, this is not essential and in alternative embodiments the error detection circuitry can have a different construction. For example, in one embodiment, the error detection circuitry comprises, for each pair of bit lines, skewed sense amplifier circuitry arranged to produce first and second outputs from the differential signals on the associated pair of bit lines for each addressed memory cell. The skewed sense amplifier circuitry is biased towards generation of an output at a first logic level rather than a second logic level, and accordingly it is more difficult to flip an output to the second logic level than would be the case in the sense amplifier circuitry used to evaluate the data value stored in the addressed memory cells. Hence, if the skewed sense amplifier circuitry can produce first and second outputs of opposite logic levels based on the differential signals evaluated by the actual sense amplifier circuitry used to detect the stored data values, this indicates that that actual sense amplifier circuitry will have evaluated the data correctly.

The skewed sense amplifier circuitry can be arranged in a variety of ways. However, in one embodiment, said skewed sense amplifier circuitry comprises a first skewed sense amplifier circuit and a second skewed sense amplifier circuit. The first skewed sense amplifier circuit is configured to receive the differential signals on the associated pair of bit lines for each addressed memory cell and to produce therefrom said first output, and the second skewed sense amplifier circuit is also configured to receive the differential signals on the associated pair of bit lines for each addressed memory cell and to produce therefrom said second output, but the differential signals having their order swapped prior to input to the second skewed sense amplifier circuit.

As with embodiments where the error detection circuitry employed comparison circuitry, there are a number of ways in which the output from the skewed sense amplifier circuitry can be evaluated. In particular, both the earlier described edge capture circuitry or the error signal generation circuitry can be used to evaluate the outputs from the skewed sense amplifier circuitry. When using the error signal generation circuitry, the earlier described further error check circuitry can also be used if desired to provide a second level of checking by comparing the output from the skewed sense amplifier circuitry with the corresponding outputs from the sense amplifier circuitry.

Viewed from a second aspect, the present invention provides a method of operating a memory device in a speculative read mode of operation, the memory device having an array of memory cells, each memory cell being coupled to an associated pair of bit lines, and read control circuitry configured during a read operation to activate a number of addressed memory cells in order to couple each addressed memory cell to its associated pair of bit lines, the method comprising: determining, during the read operation using sense amplifier circuitry coupled to the bit lines, the data value stored in each addressed memory cell by evaluation of differential signals that develop on the associated pair of bit lines during the read operation in dependence on the data value stored in that addressed memory cell; in the speculative read mode of operation, the sense amplifier circuitry evaluating the differential signals on the associated pair of bit lines for each addressed memory cell after a speculative read time period that is not guaranteed to be sufficient for the differential signals to have developed to a degree necessary for the sense amplifier circuitry to correctly determine the data value stored in each addressed memory cell; in said speculative read mode of operation, capturing in an error detection circuit the differential signals on the associated pair of bit lines for each addressed memory cell and applying an error detection operation to determine if the differential signals as evaluated by the sense amplifier circuitry had not developed to the degree necessary for the sense amplifier circuitry to correctly determine the data value stored in each addressed memory cell; and asserting an error signal if it is determined that the differential signals had not developed to the degree necessary for the sense amplifier circuitry to correctly determine the data value stored in each addressed memory cell.

Viewed from a third aspect, the present invention provides a memory device comprising: an array of memory cell means, each memory cell means for coupling to an associated pair of bit lines; read control means for activating, during a read operation, a number of addressed memory cell means in order to couple each addressed memory cell means to its associated pair of bit lines; sense amplifier means for coupling to the bit lines and for determining, during the read operation, the data value stored in each addressed memory cell means by evaluation of differential signals that develop on the associated pair of bit lines during the read operation in dependence on the data value stored in that addressed memory cell means; the sense amplifier means, in a speculative read mode of operation, for evaluating the differential signals on the associated pair of bit lines for each addressed memory cell means after a speculative read time period that is not guaranteed to be sufficient for the differential signals to have developed to a degree necessary for the sense amplifier means to correctly determine the data value stored in each addressed memory cell means; and error detection means, in said speculative read mode of operation, for capturing the differential signals on the associated pair of bit lines for each addressed memory cell means and for applying an error detection operation to determine if the differential signals as evaluated by the sense amplifier means had not developed to the degree necessary for the sense amplifier means to correctly determine the data value stored in each addressed memory cell means, and, if so, for asserting an error signal.

BRIEF DESCRIPTION OF THE DRAWINGS

The present invention will be described further, by way of example only, with reference to embodiments thereof as illustrated in the accompanying drawings, in which:

FIGS. 3A and 3B are block diagrams schematically illustrating the construction of the error detection circuitry in accordance with two embodiments that both employ edge detection circuits;

FIGS. 7A and 7B illustrate the operation of the pulse edge capture circuitry of FIGS. 6A and 6B in accordance with one embodiment;

DESCRIPTION OF EMBODIMENTS

Figure 1:
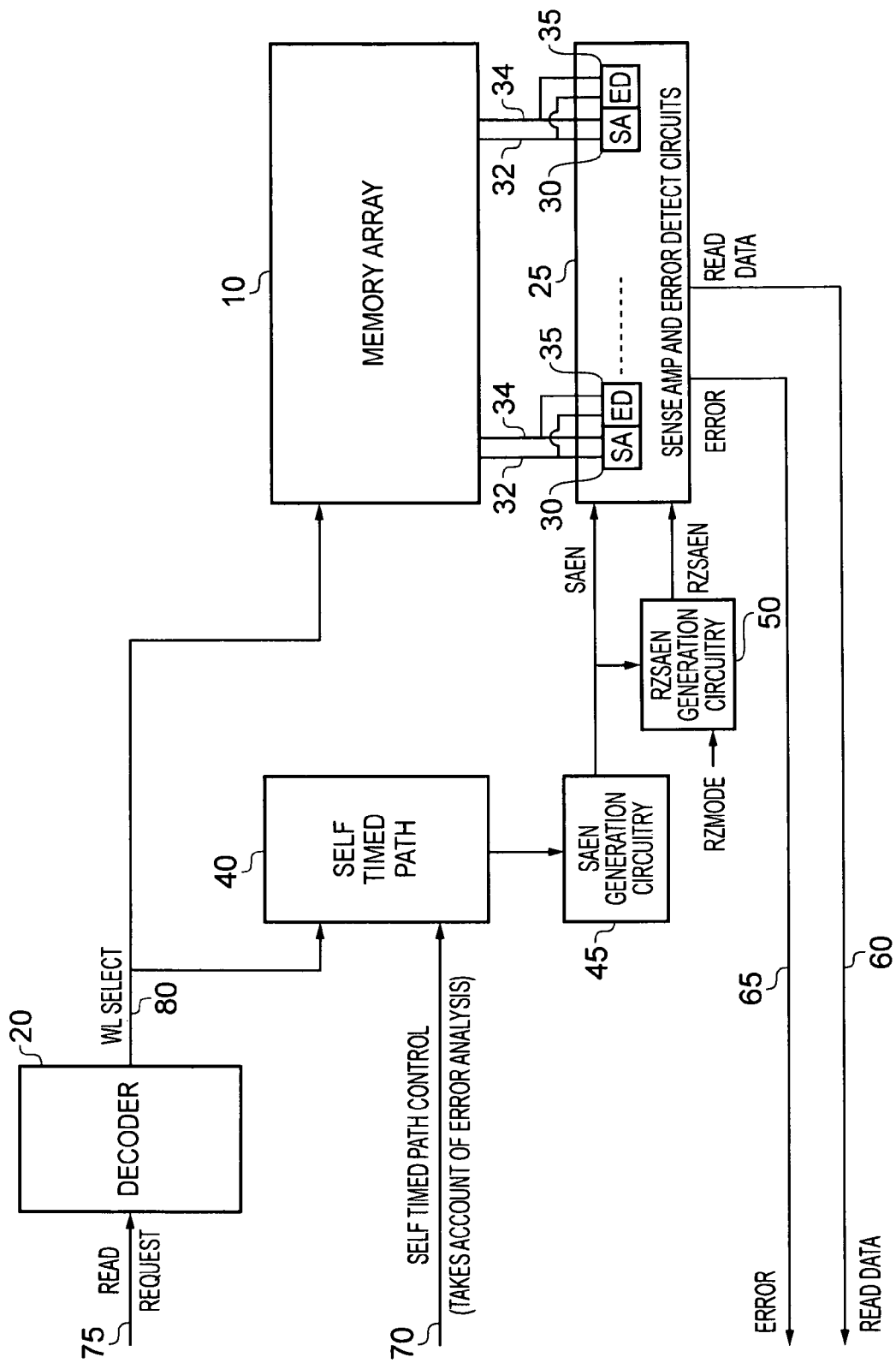
FIG. 1 is a block diagram of a memory device in accordance with one embodiment.

FIG. 1 is a block diagram of a memory device in accordance with one embodiment. For the sake of simplicity, the components used to write data into the memory array 10 of the memory device have been omitted, and such write circuitry can be provided in the standard manner. When a read request is received over path 75, the decoder circuitry 20 determines which word line within the memory array needs to be accessed in order to perform the read operation specified by the read request, and accordingly issues a word line select signal over path 80 to the memory array 10 to cause the required row of the memory array to be activated. As a result of the row being activated, each addressed memory cell within the row will be coupled to a corresponding pair of bit lines 32, 34 running through columns of the memory array. Those bit lines are also coupled to sense amplifier and error detection circuits 25, which in one embodiment include a separate sense amplifier circuit 30 and error detection circuit 35 for each pair of bit lines.

A self-timed path circuit 40 is used to determine a time at which the sense amplifier circuits 30 should be triggered in order to evaluate the signals on the various bit lines. In particular, the self-timed path is activated by the word line select signal 80 and following the elapse of a chosen time period, will then issue a control signal to the sense amp enable (SAEN) generation circuitry 45 to cause a sense amp enable (SAEN) pulse to be asserted to the sense amplifier circuits 30. The SAEN signal is used to trigger the sense amplifier circuits 30 to evaluate the differential signals that have developed on the associated pair of bit lines during the read operation. In particular, both of the bit lines 32, 34 will be precharged to a first logic level (for example Vdd) and during the read operation the voltage on one of the bit lines will discharge, which bit line discharges being dependent on the data value stored in the addressed memory cell. When triggered by the SAEN pulse, each sense amplifier 30 will evaluate the differential signals on the associated pair of bit lines 32, 34, and as a result determine the data value stored in the corresponding addressed memory cell. That read data will then be output over the read data path 60 to the processing circuit that issued the read request.

In one embodiment, the memory device supports a speculative read mode of operation where the time period measured by the self-timed path is chosen to be short enough that it will not necessarily guarantee to allow sufficient time for the differential signals on the bit lines to have developed to the degree necessary to ensure that the sense amplifier circuits 30 correctly determine the data value stored in each addressed memory cell when triggered by the SAEN signal. In that mode of operation, the associated error detection circuits 35 are employed to perform an error detection operation based on the differential signals as evaluated by the associated sense amplifier circuit 30. In one embodiment as shown in FIG. 1, the error detection circuits 35 are activated by an RZSAEN signal (Razor SAEN signal) produced by the RZSAEN generation circuitry 50 upon receipt of an asserted SAEN signal from the SAEN generation circuitry 45.

If an error detection circuit 35 determines that the differential signals as evaluated by the sense amplifier circuit had not developed to the degree necessary to ensure correct operation of the sense amplifier circuit, then an error signal is asserted over path 65. This will typically be issued to the processing device that had issued the read request, so that that processing device can take corrective action, for example by flushing any processing that had been performed based on the read data output over path 60 prior to receipt of the asserted error signal. The read request can then be reissued if necessary.

In one embodiment, read time period adjustment circuitry can also be provided for issuing a control signal over path 70 to the self-timed path 40, that control signal taking into account the error signals asserted over path 65. In one embodiment, such read time period adjustment circuitry may be provided internally as part of the memory device, but in an alternative embodiment (as shown in FIG. 1) that read time period adjustment circuitry may be provided externally to the memory device, for example as part of the processing device that is reading the data. Hence, based on an analysis of the error signals asserted over path 65, the read time period adjustment circuitry may determine that it is appropriate to extend the speculative read timing to improve the chances of the sense amplifier circuitry correctly evaluating the stored data in the memory cells on the basis of the differential signals developing on the bit lines during the read operation. Accordingly, a control signal can be issued over path 70 to adjust the time delay of the self-timed path, and hence adjust the time period before the SAEN signal is asserted to the sense amplifiers 30.

In one embodiment, the memory device may permanently operate in the speculative read mode of operation. However, in an alternative embodiment, the memory device may be operable in either the speculative read mode of operation or a non-speculative read mode of operation. In the non-speculative read mode of operation, the self-timed path 40 will provide an increased time period that is longer than the speculative read time period and is guaranteed to be sufficient for the differential signals to have developed to the necessary degree to ensure correct sensing by the sense amplifiers when the SAEN signal is asserted.

In one embodiment, when in the non-speculative read mode of operation, a speculative mode signal (referred to in FIG. 1 as the RZMODE signal) will be de-asserted, in order to disable the RZSAEN generation circuitry 50. As a result, no RZSAEN signals will be asserted to the error detection circuits 35, and accordingly the error detection circuits will be disabled. It will be appreciated that in that embodiment the memory device hence operates in a standard manner, with the read time being long enough to ensure that the differential signals on the bit lines have developed to the degree necessary to ensure correct data value detection by the sense amplifier circuits.

Figure 2:
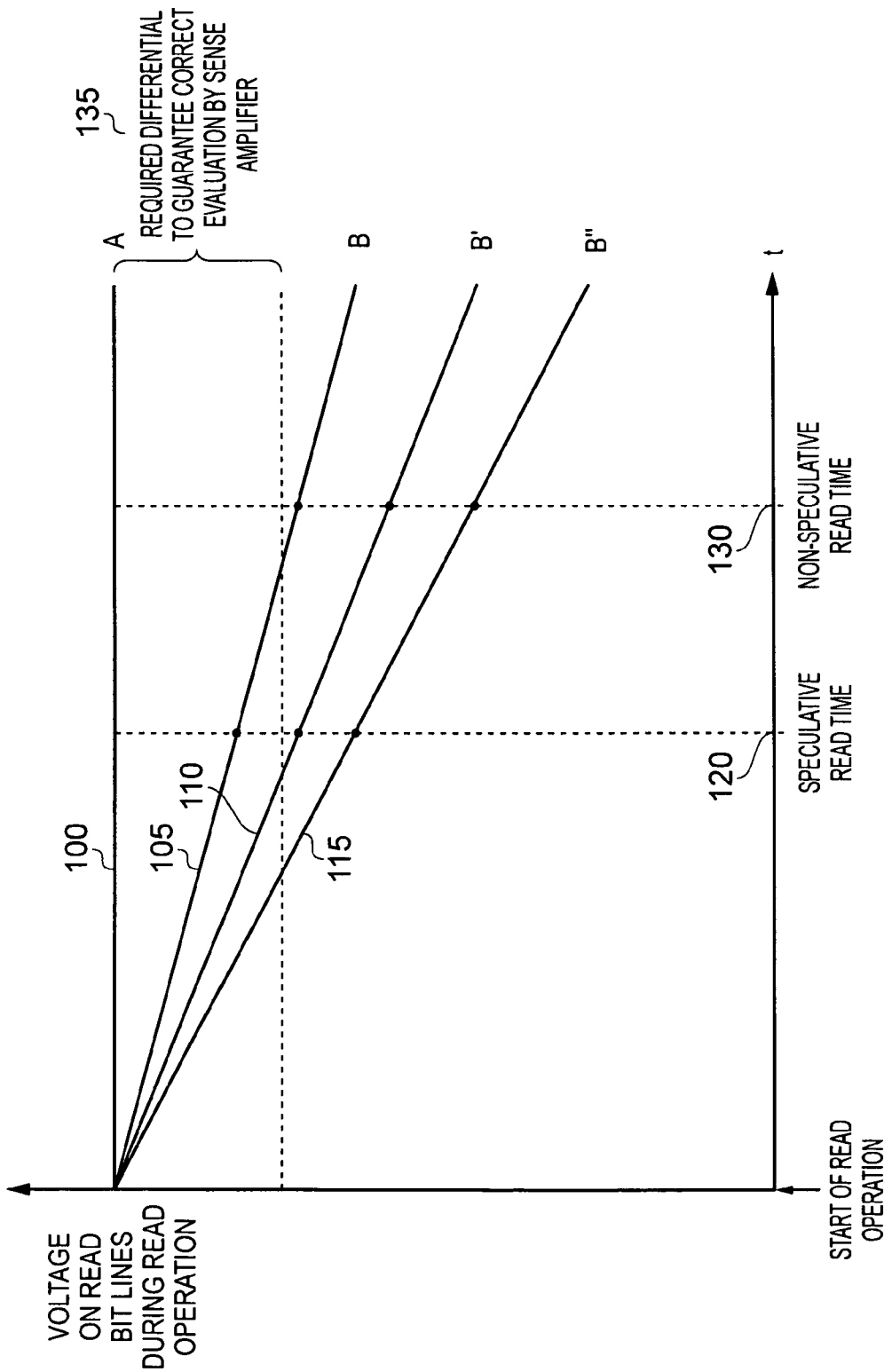
FIG. 2 is a graph schematically illustrating how errors in the data detected by the sense amplifier circuitry may arise when using a speculative read time in accordance with one embodiment.

FIG. 2 is a graph schematically illustrating how the differential signals on a pair of bit lines may develop during the read operation. As mentioned earlier, during the read operation, the voltage on one of the bit lines will remain at the pre-charged level, whilst the voltage on the other bit line will discharge. However, the rate of discharge will depend on operating conditions and component variations. Accordingly, whilst the voltage on one of the bit lines may follow the profile of the line 100, the voltage on the other bit line could follow any of a number of discharge paths, three examples of which are schematically illustrated by the lines 105, 110, 115. Assuming the discharge line 105 represents the worst case condition, a non-speculative read time 130 can be chosen such that by the time the sense amplifiers evaluate the voltages on the pair of bit lines, the differential between the signals on the two bit lines will always exceed the required differential 135, and accordingly correct data value detection by the sense amplifier circuits is ensured.

However, when running in the speculative read mode of operation, a speculative read time 120 will be chosen which cannot be guaranteed to be sufficient for the differential signals to have developed to the required level 135. In particular, it will be seen from the example of FIG. 2 that whilst the differential signals will have developed to the necessary degree if the discharging bit line follows either the paths 110 or 115, they will not have done so if the discharging bit line follows the path 105. It is for this reason that the error detection circuits 35 are used in the speculative read mode of operation, such error detection circuits determining based on the signals as evaluated by the sense amplifier circuitry whether those signals had developed to the necessary degree (i.e. whether the differential between the signals was at least the same or greater than the differential 135). If not, an error signal is asserted over path 65 as discussed earlier.

The error detection circuits can take a variety of forms. FIG. 3A illustrates one example where absolute value comparison circuitry 200 is arranged to receive the signals on the pair of bit lines as evaluated by the associated sense amplifier, and to compare those signals with a reference value in order to produce a pair of comparison outputs. The reference value can be determined in a variety of ways, but in one embodiment an optional bias voltage can be provided to the absolute value comparison circuitry 200 against which the voltages on each bit line are compared. The absolute value comparison circuitry 200 can take a variety of forms but in one implementation involves the use of an op amp style high speed level detector, as will be discussed in more detail later with reference to FIG. 6A.

The pair of comparison outputs from the circuitry 200 are passed to edge detection circuitry 210 in the embodiment of FIG. 3A, which is arranged to determine whether one of the comparison outputs switches logical state during a timing window created based on the RZSAEN signal and a delayed version of that signal. The edge detection circuit 210 will then capture that edge transition if it occurs within the timing window and will propagate the results of the capture of the edge transition to the error detection circuit 220. The edge detector essentially takes a small signal analog level value and converts it to a full rail signal if the designated value was met. Assuming that the differential between the two signals on the bit lines matches or exceeds the required differential 135, then it is expected that one of the comparison outputs will change state during the relevant timing window and the other comparison output will not change. Accordingly, it is expected that the two signals received by the error detection circuit 220 will be at opposite logic levels. If they are not, the error detection circuit 220 will generate an error signal.

The edge detection circuit 210 provides a particularly efficient mechanism for evaluating the comparison output by determining whether the edge occurred during the pulse and then capturing it or not, dependent on implementation. Error detection circuitry 220 interprets the results and then stores the resultant error signal within the RZ_latch 230. A set error signal within the latch 230 indicates that the data may have evaluated incorrectly at the sense amplifier 30, since a sufficient differential in the bit line signals may not have been supplied to the sense amplifier 30 within the speculative read time 120. The RZ_latch 230 retains the captured error signal until reset by an error reset N (ERN) signal (which is active low). A pulsed ERN signal is used in a Razor circuit to reset all Razor latches before the next rising edge of an active read clock.

The edge detection circuit can be constructed in a variety of ways, but one particular embodiment will be discussed later with reference to FIG. 6A.

FIG. 3B illustrates an alternative embodiment of error detection circuitry 35 where skewed sense amp circuitry 240 is used instead of the absolute value comparison circuitry 200. In one embodiment, the skewed sense amp circuitry comprises a pair of skewed sense amps that are both skewed in the same direction so as to preferentially output one logic value over the other logic value. The bit lines are provided as first and second inputs to one of the skewed sense amp circuits, and are also provided in reversed order as inputs to the other skewed sense amp circuit. Given the skewed nature of the sense amp circuits used to form the skewed sense amp circuitry 240, only a sufficient differential will flip the sense amp circuitry in the opposite way to the bias of the sense amp circuitry. More specifically, a bit line differential of at least a certain value is required to overcome the sense amp bias and generate a logic 1 value creating an edge. Then if the output, or rising edge, from either of the two skewed sense amps rises during the pulsed timing window, this indicates that enough differential has been captured on one bit line, and it is then necessary to ensure that only one edge was raised and not both (or neither). This is checked by the remaining circuitry and indeed the edge detection circuit 210, error detection circuit 220, and $RZ_{latch}$ 230 operate in the same way as discussed earlier with reference to FIG. 3A.

Figure 4B:
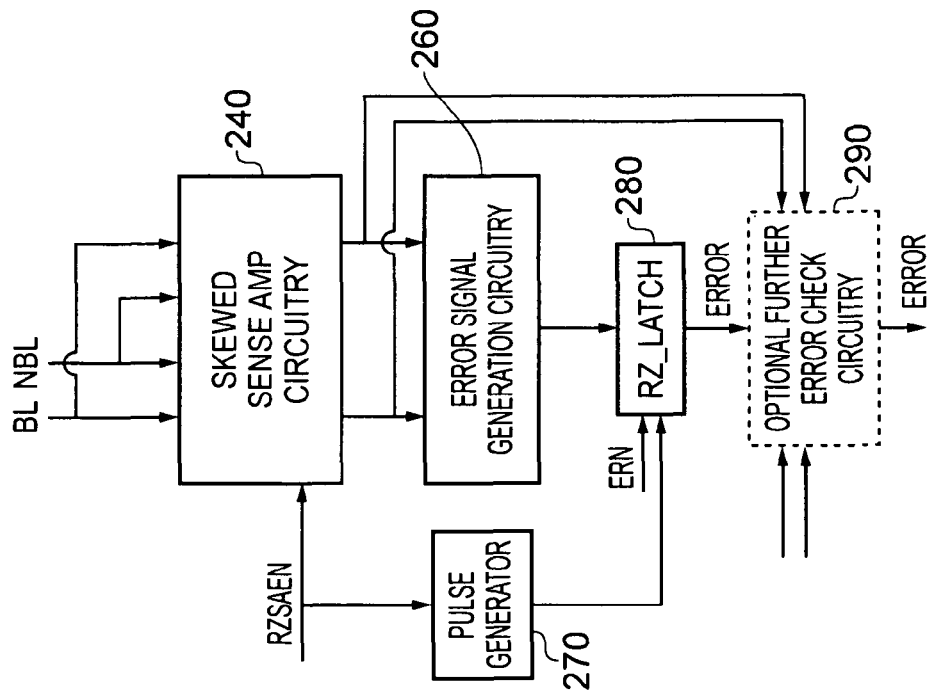
FIGS. 4A and 4B are block diagrams schematically illustrating the construction of the error detection circuitry in accordance with two embodiments that both employ error signal generation circuitry and an associated latch.
Figure 4A:
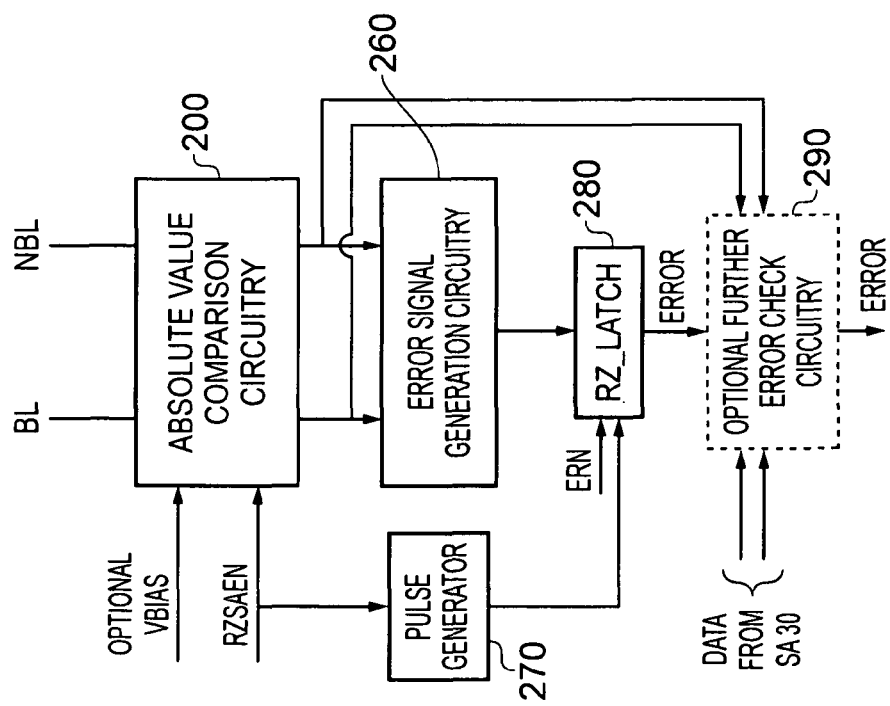

FIGS. 4A and 4B illustrate two further embodiments of error detection circuits, which correspond generally with the embodiments of FIGS. 3A and 3B, respectively, but with the edge detection circuit 210 and associated error detection circuit 220 replaced by error signal generation circuitry 260, and a latch 280 driven by the output of a pulse generator 270. Conceptually, each bit line undergoes data evaluation and comparison to ensure that their voltage levels are different.

In this embodiment, the error signal generation circuitry monitors the outputs from the absolute value comparison circuitry 200 (in the embodiment of FIG. 4A) or the skewed sense amplifier circuitry 240 (in the embodiment of FIG. 4B), and produces an internal error signal which is forwarded to the latch 280. The pulse generator 270 receives the RZSAEN signal, and generates therefrom a pulse to enable the latch 280 to latch its input from the error signal generation circuitry 260. If at the time the pulse is generated by the pulse generator, the error signal generation circuitry 260 receives input values that are at opposite logic levels, then the internal error signal will not be set, and accordingly when that value is latched by the latch 280, this will result in the error signal not being asserted. However, if the two inputs to the error signal generation circuitry 260 are at the same logic level at the time the pulse is generated, then an internal error signal will be asserted from the error signal generation circuitry 260, and will be latched within the latch 280, to thereby cause an asserted error signal to be output from the latch. As with the embodiments of FIGS. 3A and 3B, the RZ_latch 280 retains the captured error signal until reset by the error reset N (ERN) signal (which is active low).

As shown in FIGS. 4A and 4B, the error detection circuits of these embodiments may optionally include further error checking circuitry 290. In particular, when such further error checking circuitry 290 is provided, the error signal output from the latch 280 is evaluated by the circuitry 290, and if that error signal is set no further action is required, and the error output from the latch 280 is merely propagated on from the circuitry 290 as the error signal.

However, if the error signal is not set, the further error check circuitry 290 performs a comparison of the outputs from the associated sense amplifier 30 with the outputs from the absolute value comparison circuitry 200. If there is any difference between these outputs, this indicates that even though the error detection circuit has not detected an error, there is an error in the signals as evaluated by the sense amplifier 30, and in that instance the error signal as output from the circuitry 290 is set. By using such an approach, it is no longer necessary to restrict the error detection circuit to evaluate the bit line signals present on the bit lines at exactly the same time as the sense amplifier 30 samples them in the speculative read mode of operation. This hence enables the sense amplifier 30 to sample the bit lines in the speculative read mode of operation at a timing which is "borderline" (i.e. may not have allowed the differential signals to have developed to the degree necessary to ensure correct operation of the sense amplifier), with the error detection circuit then sampling the bit lines at a slightly later time just before the precharge phase starts.

Where such further error checking circuitry 290 is used, the output from that further error checking circuitry should be captured and then reset before the next read operation. This can for example be achieved by adding a further latch (not shown) at the output of the circuitry 290.

Figure 5:
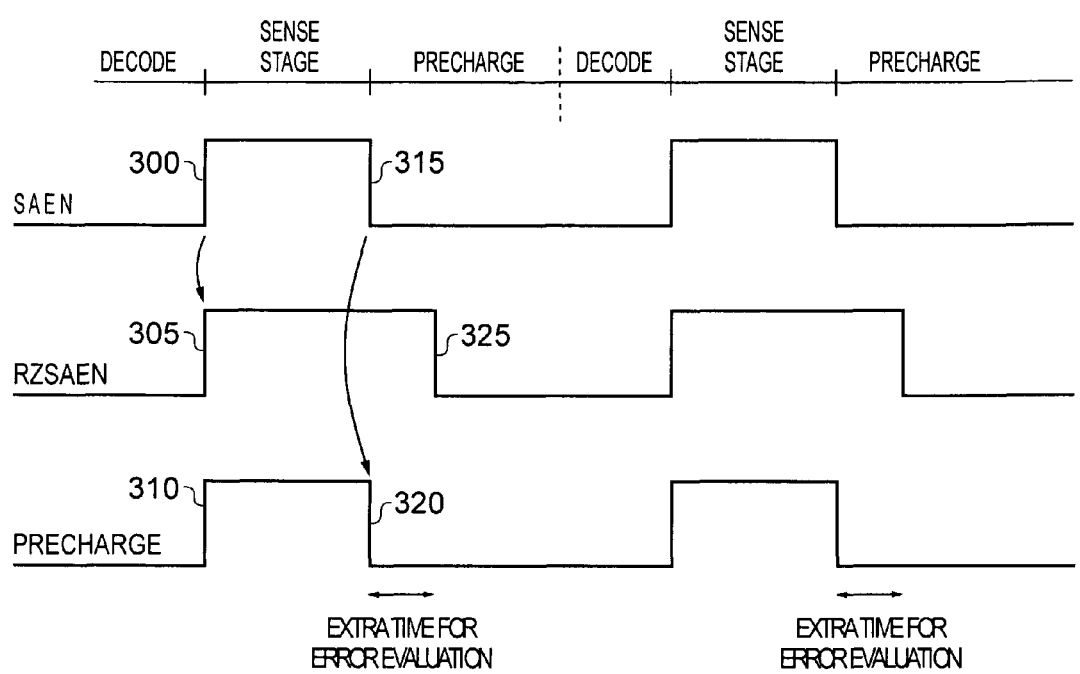
FIG. 5 illustrates how the error detection circuitry can be given an increased period of time for performing the error detection operation relative to the sense timing window of the associated sense amplifier in accordance with one embodiment.

FIG. 5 schematically illustrates the cyclic sequence of stages that occur within the memory device in order to perform a read operation. Initially, the bit lines are precharged, whereafter a read request is decoded in order to assert the required word line select signal during a decode stage. At the end of the decode stage, a sense stage takes place where the SAEN signal is asserted to the sense amplifier circuits 30 to cause them to evaluate the differential signals on the associated pair of bit lines 32, 34. During the sense stage, the precharge signal is de-asserted (in this embodiment it being assumed that a logic zero level represents an asserted precharge signal and a logic one level represents a de-asserted precharge signal). Accordingly, it can be seen that the precharge signal goes high at the point 310, approximately coincident with the SAEN signal being asserted at point 300. At the end of the sense stage, the SAEN signal is de-asserted at the point 315, which causes the precharge signal to then be asserted by the return of the precharge signal to the logic zero level at step 320.

It will be noted that the transitions 315, 320 are driven entirely by the end of the sense stage within the sense amplifier circuit 30, and are in no way dictated by the time taken for the error detection circuits 35 to perform their error detection operations. Indeed, for the sake of illustration, the example in FIG. 5 assumes that the RZSAEN signal used to activate the error detection circuits 35 may remain asserted for longer than the SAEN signal. Hence, whilst the assertion of the RZSAEN signal at point 305 is driven by the assertion of the SAEN signal at point 300, the de-assertion of the RZSAEN signal at point 325 can occur after the de-assertion of the SAEN signal at point 315 if desired, provided that the error detection operation is completed before the precharge stage is completed. This hence allows some extra time for the error evaluation without impacting on the cycle time of the memory device.

It is also possible to delay the RZSAEN signal a little so that the rising edge of that signal occurs at some point after the rising edge of the SAEN signal, when adopting the embodiments of FIGS. 4A and 4B incorporating the optional further error check circuitry 290. However, the amount of delay has to be limited to ensure that the additional comparison performed by the further error check circuitry 290 takes place before the precharge operations starts.

Figure 6A:
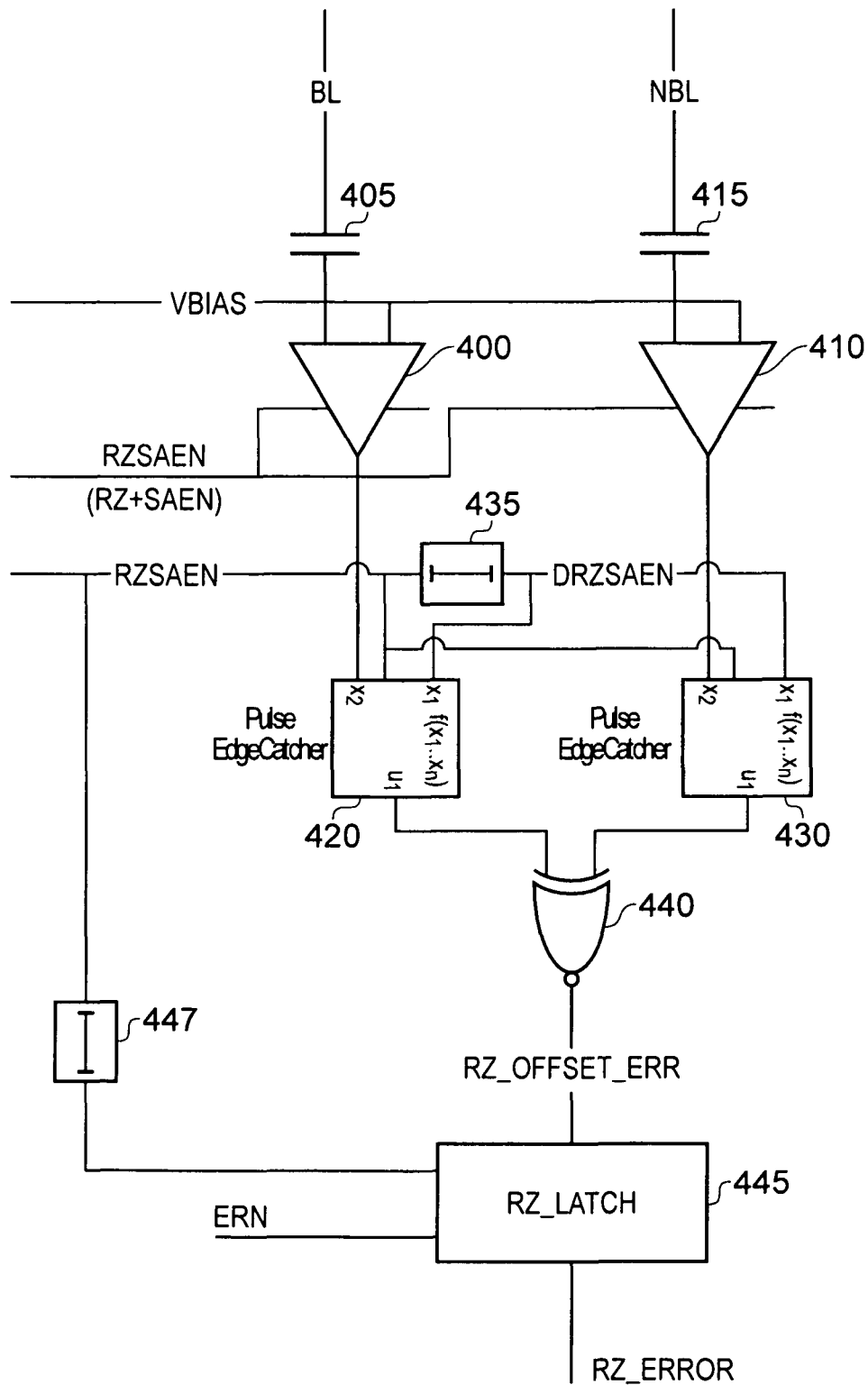
FIGS. 6A and 6B illustrate in more detail the construction of the error detection circuitry of FIGS. 3A and 3B, respectively, in accordance with one embodiment.

FIG. 6A illustrates a particular embodiment of the circuitry of FIG. 3A. In this embodiment, the absolute value comparison circuitry 200 is formed by a pair of op amp style level detectors 400, 410 which receive as one input a bias voltage, and receive as their other input an amplified version of one of the bit line signals as sampled by the sense amplifier circuit 30. In particular, the devices 405, 415 provide a gain stage in order to amplify the signals as sampled by the sense amp circuit 30, thereby providing for a quicker operation of the level detectors 400, 410. The level detectors are driven by the RZSAEN signal, and accordingly when that signal is asserted they compare the voltage on the associated bit line with the bias voltage.

In this embodiment, the RZSAEN signal and a delayed version of that signal generated by the delay element 435 are input to two pulse edge catcher circuits 420, 430 to generate a timing window during which the output from the associated level detector 400, 410 is observed. If the state of that output transitions during that timing window, that edge transition is captured and output from the associated pulse edge catcher circuit. This is illustrated schematically by FIGS. 7A and 7B. In particular, FIG. 7A illustrates a situation where the differential voltage on the bit lines reaches the required differential 135 (in this particular example that required differential being 100 mV) during the timing window 515 created by the RZSAEN signal and the delayed version of that signal. Whilst the voltage on one of the bit lines is maintained at the level 500, the voltage on the other bit line drops as shown by the line 505, and when the required differential is reached, the output from the associated level detector 400, 410 will transition from a logic zero to a logic one value at the edge 510. Since this edge is observed during the timing window 515, this will result in the associated pulse edge catcher circuit 420, 430 outputting a logic one level 520 to indicate that the edge has been detected.

By contrast, FIG. 7B illustrates an example where the voltages on the bit lines do not diverge quickly enough, and accordingly during the timing window 515, they have not diverged enough to cause an edge transition in the output from either level detector 400, 410. Accordingly no edge is detected by the pulse edge catcher and a logic zero value is output.

Assuming the signals have transitioned sufficiently by the time the SAEN signal is asserted to the sense amplifier 30, then it will be expected that, during the timing window created by the RZSAEN signal within the edge detectors 35, the output from one level detector will transition while the other will not, and accordingly one pulse edge catcher will output a logic one value whilst the other pulse edge catcher outputs a logic zero value. As shown in FIG. 6A, both these outputs are input to an XNOR gate 440 which will output a logic zero value whilst the two inputs differ. Accordingly, no error signal will be asserted whilst the two inputs differ. However, if both inputs have the same logic value, an error signal will be asserted, since this will indicate that the differential signals on the bit lines had not developed to the necessary extent by the time the sense amplifiers 30 were fired to evaluate the bit lines.

The output from the XNOR gate 440 is latched within the latch 445, which is driven by an enable signal arranged by virtue of the delay element 447 to be a delayed version of the RZSAEN signal (referred to herein as the RZSAENL signal), in order to latch the output from the XNOR gate 440 as present at the end of the timing window 515. This latched value is then output from the latch 445 as the RZ_Error signal, and the latch 445 retains the captured error signal until reset by the active low ERN signal.

Figure 6B:
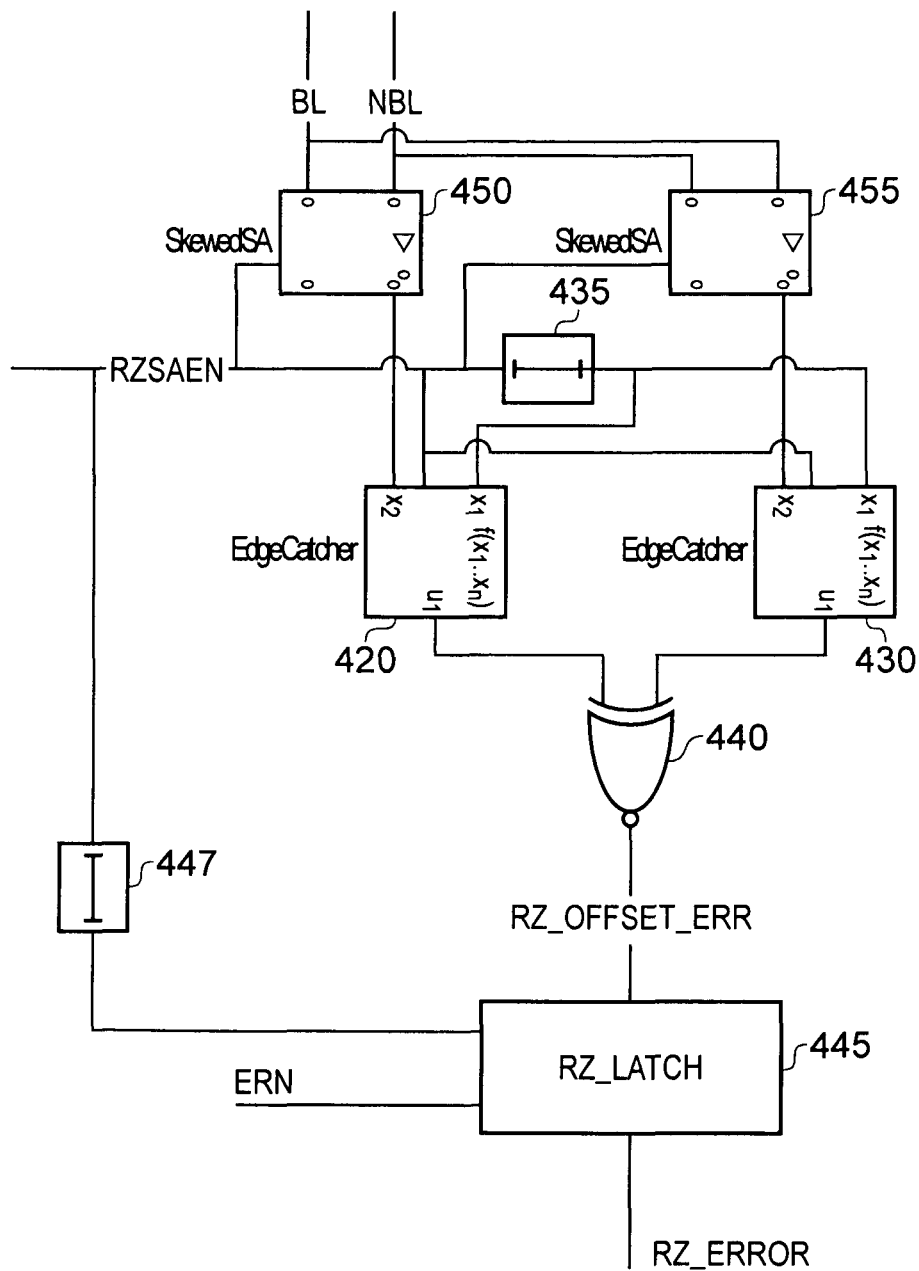

FIG. 6B illustrates an example embodiment of the circuitry of FIG. 3B, and in particular illustrates two skewed sense amplifiers 450, 455 that are activated via the RZSAEN signal. As shown in FIG. 6B, the pair of bit lines are provided as inputs to both skewed sense amplifiers, but their order is reversed between the skewed sense amplifier 450 and the skewed sense amplifier 455. The edge detection circuitry 420, 430, 435, 440 is the same as described in FIG. 6A and operates in the same manner. Assuming both the skewed sense amplifier circuits 450, 455 initially output a logic zero level, it would be expected that, when they are activated by the RZSAEN signal to evaluate the voltages on the bit lines at the time they are sensed by the sense amplifier circuits 30, one of the outputs will flip to a logic one state and be captured during the timing window 515. If this does in fact occur, then given the skewed nature of the sense amplifiers which ensures that this flipping to the logic one state will be more difficult to achieve than within the standard sense amplifier circuit 30, this means that the differential signals on the bit lines will have developed to a sufficient level to ensure the sense amplifier circuit 30 has operated correctly. However, if this does not occur, and accordingly both outputs remain at a logic zero level (or indeed if both outputs transition to a logic one level), this will indicate an error condition, and will be detected by the XNOR gate 440 on the basis of the outputs from the two edge catcher circuits 420, 430.

Figure 8A:
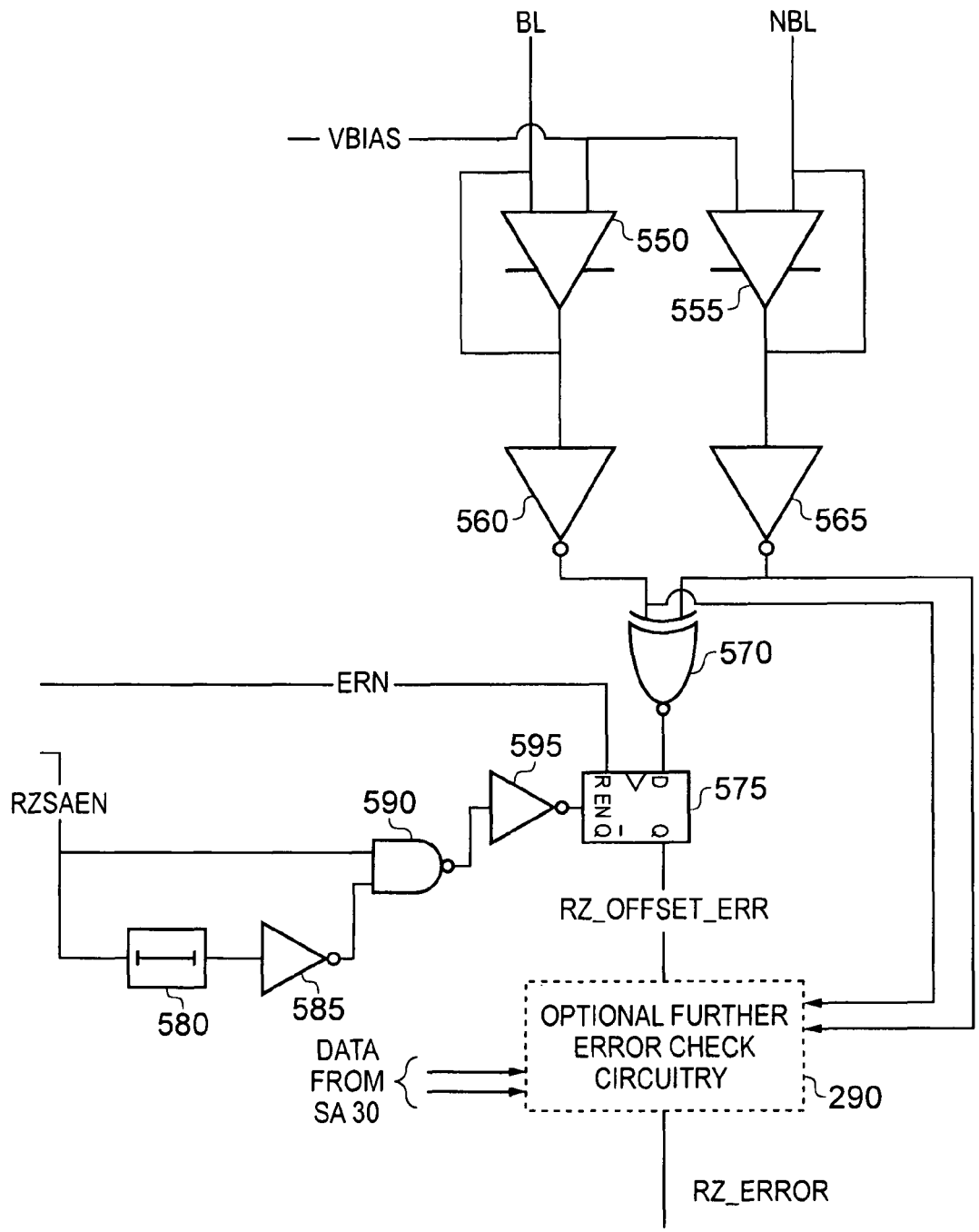
FIGS. 8A and 8B illustrate in more detail the construction of the error detection circuitry of FIGS. 4A and 4B, respectively, in accordance with one embodiment.

FIG. 8A illustrates an example embodiment of the circuitry of FIG. 4A. The level detector circuits 550, 555 correspond generally with the level detector circuits 400, 410 of FIG. 6A, keeping the reference voltage (VBIAS) but adding offset compensation which decreases the sensing (differential) requirements. Alternatively, capacitor devices similar to the devices 405, 415 in FIG. 6A could be used to amplify the bit line signals, which would then allow the bias circuit provided by the feedback loop between the output and the input of the level detector circuits 550, 555 to be removed. Whilst in FIG. 6A the bit line inputs are both provided as the left-hand inputs to the components 400, 410, in the example of FIG. 8A the bit line inputs are provided to opposite inputs of the components 550, 555.

In this example, the data evaluation is performed by a sensitive amplifier which may or may not develop a full rail signal fast enough. To assist, the inverters 560, 565 are used to capture the edge output from the components 550, 555 (which could be close to Vdd/2) and generates therefrom a full rail signal. The error signal generation circuitry 260 of FIG. 4A is formed by the XNOR gate 570. This circuitry continuously evaluates the outputs from the two level detectors, and it will be appreciated that the output from the XNOR gate 570 will be at a logic zero value whilst the outputs of the two level detectors differ, and will be at a logic one value whilst the two outputs are the same.

The components 580, 585, 590, 595 form the pulse generator 270 of FIG. 4A. In particular, it can be seen that the NAND gate 590 will output a logic one value except for during a small pulse window after the RZSAEN signal is asserted. In particular, immediately after the assertion of the RZSAEN signal, both inputs to the NAND gate 590 will be at a logic one level, causing the NAND gate to output a logic zero level. However, this output will return to the logic one level once the asserted RZSAEN signal has propagated over the second path via the delay element 580 and the inverter 585 to cause the second input to the NAND gate to transition to a logic zero level. Due to the presence of the inverter 595, it will be seen that the pulse generator hence provides a short logic one level pulse to the enable input of the latch 575 following the assertion of the RZSAEN signal.

Whilst the latch is enabled, it will sample the output from the XNOR gate 570 and that sampled value will then be provided as the output error signal from the latch 575. A reset signal ERN can then be used to reset the latch as discussed earlier with reference to the latch 280 of FIG. 4A.

Optional further error check circuitry 290 can also be provided if desired, and will operate as discussed earlier with reference to the embodiment of FIG. 4A.

Figure 8B:
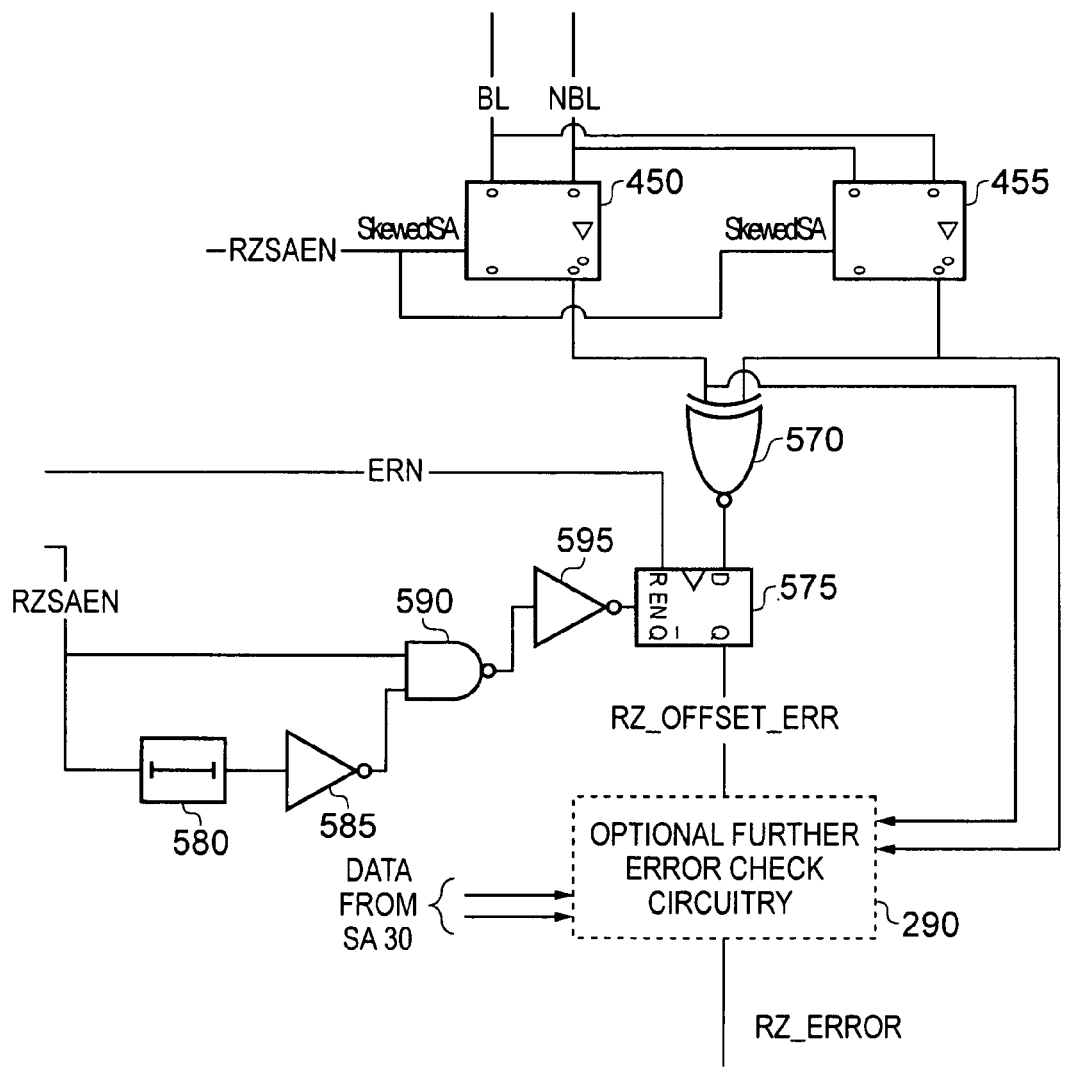

FIG. 8B is a particular example embodiment of the circuitry of FIG. 4B. From a comparison with FIG. 8A, it will be seen that the error signal generation is performed in the same manner, but the inputs to the XNOR gate 570 are provided from the pair of skewed sense amplifier circuits 450, 455 in the embodiment of FIG. 8B. These skewed sense amplifier circuits 450, 455 operate in the same way as discussed earlier with reference to FIG. 6B. As with FIG. 8A, the further error check circuitry 290 can also be provided if desired, and will operate as discussed earlier with reference to the embodiment of FIG. 4B.

Figure 9:
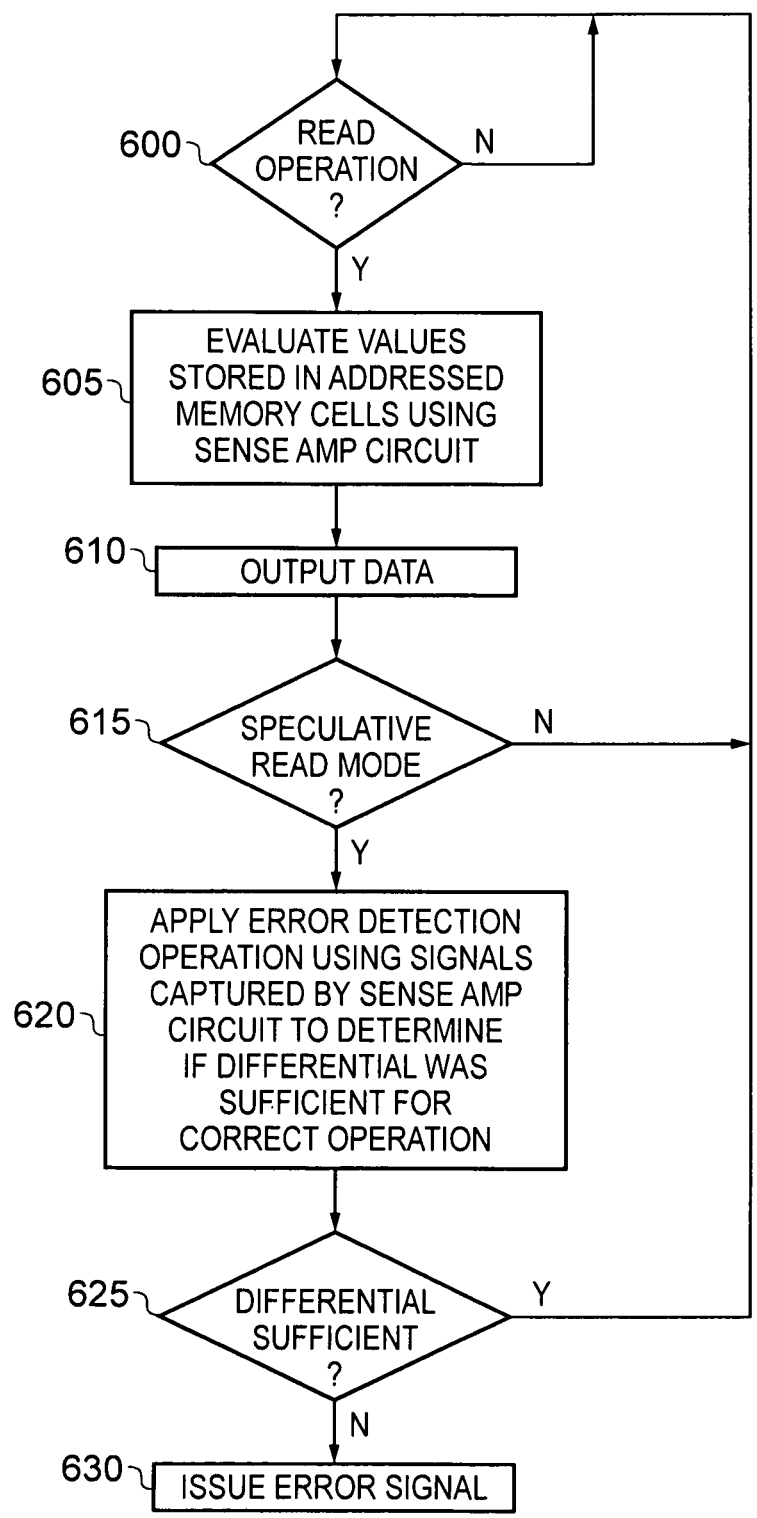
FIG. 9 is a flow diagram illustrating the operation of the sense amp and error detection circuits of FIG. 1 in accordance with one embodiment.

FIG. 9 is a flow diagram schematically illustrating the operations performed by the sense amp and error detect circuits 25 of FIG. 1 in accordance with one embodiment. Firstly, it is determined at step 600 whether a read operation is being performed, and if not no action is required by the circuitry 25. However, assuming a read operation is being performed, then at step 605 the value stored in the addressed memory cells are evaluated using the sense amp circuits 30 when the SAEN signal is asserted. The data is then output over path 60 at step 610.

At step 615, it is determined whether the memory device is being operated in a speculative read mode of operation. If not, then no further action is required and the process returns to step 600. However, assuming the device is operating in a speculative read mode, then an error detection operation is applied by the error detection circuits 35 using the signals as captured by the sense amp circuits 30 in order to determine if the differential in the voltages on the bit line pairs were sufficient for correction operation of the sense amplifiers. It is then determined at step 625 whether the differential was sufficient, and if so no action is required and the process returns to step 600. However, if the differential is not sufficient, then an error signal is asserted at step 630 over the path 65.

Whilst for ease of illustration the steps of FIG. 9 are shown sequentially, it will be appreciated that some of these steps may be performed at least partly in parallel (for example step 620 may be initiated in parallel with step 605).

From the above described embodiments, it will be appreciated that such embodiments provide an error detection circuit which determines late generation of differential signals arriving at a sense amplifier, and which consequently triggers an error flag indicating correct sensing has not completed by the sense amplifier circuitry and hence the output data is not guaranteed to be correct. This hence enables determination of potential read errors when operating the memory device in a speculative read mode of operation in order to increase performance of the memory device. The error signals generated can be used to tune the internal self-timed path circuits to control sense amplifier firing timing. They can additionally assist in characterising sense amplifiers by virtue of providing individual sense amplifier error generation.

When using the techniques of the described embodiments, an error flag is generated when the differential data on the bit lines connected to an addressed memory cell does not meet the setup and hold time requirements for the sense amplifier circuit connected to those bit lines as it is triggered by an SAEN signal of a certain pulse width. The error signals can be used not only to indicate the probability of successful reading by the sense amplifier circuits, but can also be used to assist in the tuning of the memory device to achieve optimum performance.

In some embodiments, each error detection circuit can include further error checking circuitry which, in the event that no error is detected from the bit line signals input to the error detection circuit, performs an additional level of checking to determine whether the evaluated data output from the error detection circuit differs from the evaluated data sensed by the associated sense amplifier when operating in the speculative read mode of operation and, in the event of such a difference being detected, to then generate an error signal.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

I claim:

1. A memory device comprising:
    an array of memory cells, each memory cell being coupled to an associated pair of bit lines;
    read control circuitry configured during a read operation to activate a number of addressed memory cells in order to couple each addressed memory its associated pair of bit lines;
    sense amplifier circuit coupled to the bit lines and configured during the read operation to determine the data value stored in each addressed memory cell by evaluation of differential signals that develop on the associated pair of bit lines during the read operation in dependence on the data value stored in that addressed memory cell;
    the sense amplifier circuitry being configured in a speculative read mode of operation to evaluate the differential signals on the associated pair of bit lines for each addressed memory cell after a speculative read time period that is not guaranteed to be sufficient for the differential signals to have developed to a degree necessary for the sense amplifier circuitry to correctly determine the data value stored in each addressed memory cell; and
    error detection circuitry configured, in said speculative read mode of operation, to capture the differential a on the associated pair of bit lines for each addressed memory cell and to apply an error detection operation to determine if the differential signals as evaluated by the sense amplifier circuitry had not developed to the degree necessary for the sense amplifier circuitry to correctly determine the data value stored in each addressed memory cell, and if so to assert an error signal, wherein said error detection circuitry comprises, for each pair of bit lines, comparison circuitry configured to independently compare with a reference value the value of the differential signals on the associated pair of bit lines for each addressed memory cell, in order to produce a pair of comparison outputs.

2. A memory device as claimed in claim 1, wherein the error detection circuitry is configured to capture the differential signals as evaluated by the sense amplifier circuitry.

3. A memory device as claimed in claim 1, further comprising:
read time period adjustment circuitry for adjusting the speculative read time period in response to the error signal being asserted by the error detection circuitry.

4. A memory device as claimed in claim 1, wherein in a non-speculative read mode of operation the sense amplifier circuitry is configured to evaluate the differential signals on the associated pair of bit lines for each addressed memory cell after a non-speculative read time period longer than said speculative read time period, said non-speculative read time period being guaranteed to be sufficient for the differential signals to have developed to a degree necessary for the sense amplifier circuitry to correctly determine the data value stored in each addressed memory cell.

5. A memory device as claimed in claim 4, wherein in said non-speculative read mode of operation said error detection circuitry is disabled.

6. A memory device as claimed in claim 1, wherein said error detection circuitry further comprises a gain circuit at the input to the comparison circuitry to amplify the differential signals as evaluated by the sense amplifier circuitry before input to the comparison circuitry.

7. A memory device as claimed in claim 1, wherein the comparison circuitry is configured to compare with the reference value the differential signals as evaluated by the sense amplifier circuitry, and the error detection circuitry further comprises edge capture circuitry connected to the pair of comparison outputs from the comparison circuitry and arranged to determine whether one of those comparison outputs changes logic state during a pulse period whose timing is derived from the speculative read time period.

8. A memory device as claimed in claim 7, wherein said error signal is set if neither of the comparison outputs change logic state during the pulse period or if both of the comparison outputs change logic state during the pulse period.

9. A memory device as claimed in claim 1, wherein the error detection circuitry further comprises:
error signal generation circuitry for receiving the pair of comparison outputs and for asserting an internal error signal if the comparison outputs have the same value; and
a latch configured to capture the value of the internal error signal in a predetermined timing window and to output the latched value as said error signal.

10. A memory device as claimed in claim 9, wherein the error detection circuitry further comprises further error check circuitry, responsive to the error signal output from said latch indicating that no error has been detected, to compare the pair of comparison outputs from the comparison circuitry with the equivalent outputs from the sense amplifier circuitry and to modify the error signal to identify the presence of an error if the outputs from the comparison circuitry do not match the equivalent outputs from the sense amplifier circuitry.

11. A memory device comprising:
an array of memory cells each memory cell being coupled to an associated pair of bit lines;
read control circuitry configured during a read operation to activate a number of addressed memory cells in order to couple each addressed memory cell to its associated pair of bit lines;
sense amplifier circuitry coupled to the bit lines and configured during the read operation to determine the data value stored in each addressed memo cell by evaluation of differential signals that develop on the associated pair of bit lines during the read operation in dependence on the data value stored in that addressed memory cell;
the sense amplifier circuitry being configured in a speculative read mode of operation to evaluate the differential signals on the associated pair of bit lines for each addressed memory cell after a speculative read time period that is not guaranteed to be sufficient for the differential signals to have developed to a degree necessary for the sense amplifier circuitry to correctly determine die data value stored in each addressed memory cell; and
error detection circuitry configured, in said speculative read mode of operation, to capture the differential signals on the associated pair of bit lines for each addressed memory cell and to apply an error detection operation to determine if the differential signals as evaluated by the sense amplifier circuitry had not developed to the degree necessary for the sense amplifier circuitry to correctly determine the data value stored in each addressed memory cell, and if so to assert an error signal, wherein said error detection circuitry comprises, for each pair of bit lines, skewed sense amplifier circuit arranged to produce first and second outputs from the differential signals on the associated pair of bit lines for each addressed memory cell, wherein:
said skewed sense amplifier circuitry comprises a first skewed sense amplifier circuit and a second skewed sense amplifier circuit;
the first skewed sense amplifier circuit is configured to receive the differential signals on the associated pair of bit lines for each addressed memory cell and to produce therefrom said first output; and
the second skewed sense amplifier circuit is also configured to receive the differential signals on the associated pair of bit lines for each addressed memory cell and to produce therefrom said second output, but the differential signals having their order swapped prior to input to the second skewed sense amplifier circuit.

12. A memory device comprising:
an array of memory cells, each memory cell being coupled to an associated pair of bit lines;
read control circuitry configured during a read operation to activate a number of addressed memory cells in order to couple each addressed memory cell to its associated pair of bit lines;
sense amplifier circuitry coupled to the bit lines and configured during the read operation to determine the data value stored in each addressed memory cell by evaluation of differential signals that develop on the associated pair of bit lines during the read operation in dependence on the data value stored in that addressed memo cell;
the sense amplifier circuitry being configured in a speculative read mode of operation to evaluate the differential signals on the associated pair of bit lines for each addressed memory cell after a speculative read time period that is not guaranteed to be sufficient for the differential signals to have developed to a degree necessary for the sense amplifier circuitry to correctly determine the data value stored in each addressed memory cell; and error detection circuitry configured, in said speculative read mode of operation, to capture the differential signals on the associated pair of bit lines for each addressed memory cell and to apply an error detection operation to determine if the differential signals as evaluated by the sense amplifier circuitry had not developed to the degree necessary for the sense amplifier circuitry to correctly determine the data value stored in each addressed memory cell, and if so to assert an error signal, wherein said error detection circuitry comprises, for each pair of bit lines, skewed sense amplifier circuitry arranged to produce first and second outputs from the differential signals on the associated pair of bit lines for each addressed memory cell, wherein the error detection circuitry further comprises:

error signal generation circuitry for receiving the first and second outputs produced by the skewed sense amplifier circuitry and for asserting an internal error signal if the first and second outputs have the same value; and a latch configured to capture the value of the internal error signal in a predetermined timing window and to output the latched value as said error signal.

13. A memory device as claimed in claim 12, wherein the error detection circuitry further comprises further error check circuitry, responsive to the error signal output from said latch indicating that no error has been detected, to compare the first and second outputs from the skewed sense amplifier circuitry with the equivalent outputs from the sense amplifier circuitry and to modify the error signal to identify the presence of an error if the outputs from the skewed sense amplifier circuitry do not match the equivalent outputs from the sense amplifier circuitry.

14. A memory device comprising:

an array of memory cells, each memo cell being coupled to an associated pair of bit lines;

read control circuitry configured during a read operation to activate a number of addressed memory cells in order to couple each addressed memory cell to its associated pair of bit lines;

sense amplifier circuitry coupled to the bit lines and configured during the read operation to determine the data value stored in each addressed memory cell by evaluation of differential signals that develop on the associated pair of bit lines during the read operation in dependence on the data value stored in that addressed memory cell;

the sense amplifier circuitry being configured in a speculative read mode of operation to evaluate the differential signals on the associated pair of bit lines for each addressed memory cell after a speculative read time period that is not guaranteed to be sufficient for the differential signals to have developed to a degree necessary for the sense amplifier circuitry to correctly determine the data value stored in each addressed memory cell; and error detection circuitry configured, in said speculative read mode of operation, to capture the differential signals on the associated pair of bit lines for each addressed memory cell and to apply an error detection operation to determine if the differential signals as evaluated by the sense amplifier circuitry had not developed to the degree necessary for the sense amplifier circuitry to correctly determine the data value stored in each addressed memory cell, and if so to assert an error signal, wherein said error detection circuitry comprises, for each pair of bit lines, skewed sense amplifier circuitry arranged to produce first and second outputs from the differential a the associated air of bit lines for each addressed memory cell, wherein the skewed sense amplifier circuitry is arranged to produce the first and second outputs from the differential signals as evaluated by the sense amplifier circuitry, and the error detection circuitry further comprises edge capture circuitry connected to the first and second outputs from the skewed sense amplifier circuitry, and arranged to determine whether one of those first and second outputs changes logic state during a pulse period whose timing is derived from the speculative read time period.

15. A memory device as claimed in claim 14, wherein said error signal is set if neither of the first and second outputs change logic state during the pulse period or if both of the first and second outputs change logic state during the pulse period.

16. A method of operating a memory device in a speculative read mode of operation, the memory device having an array of memory cells, each memory cell being coupled to an associated pair of bit lines, and read control circuitry configured during a read operation to activate a number of addressed memory cells in order to couple each addressed memory cell to its associated pair of bit lines, the method comprising:

determining, during the read operation using sense amplifier circuitry coupled to the bit lines, the data value stored in each addressed memory cell by evaluation of differential signals that develop on the associated pair of bit lines during the read operation in dependence on the data value stored in that addressed memory cell;

in the speculative read mode of operation, the sense amplifier circuitry evaluating the differential signals on the associated pair of bit lines for each addressed memory cell after a speculative read time period that is not guaranteed to be sufficient for the differential signals to have developed to a degree necessary for the sense amplifier circuitry to correctly determine the data value stored in each addressed memory cell;

in said speculative read mode of operation, capturing in an error detection circuit the differential signals on the associated pair of bit lines for each addressed memory cell and applying an error detection operation to determine if the differential signals as evaluated by the sense amplifier circuitry had not developed to the degree necessary for the sense amplifier circuitry to correctly determine the data value stored in each addressed memory cell; and asserting an error signal if it is determined that the differential signals had not developed to the degree necessary for the sense amplifier circuitry to correctly determine the data value stored in each addressed memory cell, wherein said step of applying an error detection operation comprises, for each pair of bit lines independently comparing with a reference value the value of the differential signals on the associated pair of bit lines for each addressed memory cell in order to produce a pair of comparison outputs.

17. A memory device comprising:

an array of memory cell means, each memory cell means for coupling to an associated pair of bit lines;

read control means for activating, during a read operation, a number of addressed memory cell means in order to couple each addressed memory cell means to its associated pair of bit lines;

sense amplifier means for coupling to the bit lines and for determining, during the read operation, the data value stored in each addressed memory cell means by evaluation of differential signals that develop on the associated pair of bit lines during the read operation in dependence on the data value stored in that addressed memory cell means;

the sense amplifier means, in a speculative read mode of operation, for evaluating the differential signals on the associated pair of bit lines for each addressed memory cell means after a speculative read time period that is not guaranteed to be sufficient for the differential signals to have developed to a degree necessary for the sense amplifier means to correctly determine the data value stored in each addressed memory cell means; and error detection means, in said speculative read mode of operation, for capturing the differential signals on the associated pair of bit lines for each addressed memory cell means and for applying an error detection operation to determine if the differential signals as evaluated by the sense amplifier means had not developed to the degree necessary for the sense amplifier means to correctly determine the data value stored in each addressed memory cell means, and, if so, for asserting an error signal, wherein said error detection means comprises, for each pair of bit lines, comparison means for independently comparing with a reference value the value of the differential signals on the associated pair of bit lines for each addressed memory cell means, in order to produce a pair of comparison outputs.

* * * * *